United States Patent [19]
Vogt

[11] Patent Number: 5,742,202
[45] Date of Patent: Apr. 21, 1998

[54] METHOD AND APPARATUS FOR DYNAMIC AUTOMATIC GAIN CONTROL WHEN PILOT SIGNAL IS LOST

[75] Inventor: Stephan W. Vogt, Lawrenceville, Ga.

[73] Assignee: Scientific-Atlanta, Inc., Norcross, Ga.

[21] Appl. No.: 651,651

[22] Filed: May 31, 1996

[51] Int. Cl.$^6$ ............................ H03F 3/66; H03G 3/30
[52] U.S. Cl. ........................ 330/52; 330/129; 330/289
[58] Field of Search ........................ 330/51, 52, 129, 330/284, 289

[56] References Cited

U.S. PATENT DOCUMENTS

| | | | |
|---|---|---|---|
| 2,269,408 | 1/1942 | Kinsburg | 333/16 |
| 2,326,871 | 8/1943 | Mallinckrodt | 333/2 |
| 2,752,571 | 6/1956 | Terroni | 333/16 |
| 2,758,281 | 8/1956 | Carleson | 333/16 |
| 2,768,353 | 10/1956 | Mansson | 333/16 |
| 2,921,267 | 1/1960 | Thomas | 330/144 |
| 3,109,999 | 11/1963 | Zirwas | 333/16 |
| 3,328,716 | 6/1967 | Fish et al. | 330/138 |
| 3,441,866 | 4/1969 | Barber et al. | 330/52 |
| 3,470,480 | 9/1969 | Smart et al. | 455/237.1 |
| 3,470,498 | 9/1969 | Serrure | 333/2 |
| 3,510,793 | 5/1970 | Barber | 330/51 |
| 3,569,869 | 3/1971 | Sutton, Jr. et al. | 330/51 |
| 3,766,486 | 10/1973 | Ouvrier | 330/52 |
| 3,781,703 | 12/1973 | Duty | 330/52 |
| 3,804,995 | 4/1974 | Beckr | 179/170 A |
| 4,030,034 | 6/1977 | Ruegg | 455/250.1 |
| 4,158,113 | 6/1979 | Lacroix | 179/170 A |
| 4,166,981 | 9/1979 | Marchasson et al. | 330/52 |
| 5,313,657 | 5/1994 | Sakamoto et al. | 455/67.4 |

*Primary Examiner*—Steven Mottola
*Attorney, Agent, or Firm*—Kenneth M. Massaroni; John Victor Pezdek; Frederick W. Powers, III

[57] ABSTRACT

The automatic gain control circuit of the present invention improves upon conventional techniques using a pilot carrier for control by monitoring for the presence of the pilot carrier. If the pilot carrier level is at an undetectable level, it will switch control of the level control section of the automatic gain control circuit to the equivalent thermal setting by means of a switch. The switch connects the output of a temperature-sensing network to a Bode driving circuit that approximates attenuation of a given transmission medium over temperature. The gain setting will therefore be based on an approximation of what the cable losses should be at the detected temperature of the amplifier housing. The present invention provides dynamic gain adjustment, even in the event of pilot carrier signal loss.

22 Claims, 3 Drawing Sheets

METHOD AND APPARATUS FOR DYNAMIC AUTOMATIC GAIN CONTROL WHEN PILOT SIGNAL IS LOST

FIELD OF THE INVENTION

The present invention relates to an automatic gain control circuit in a telecommunication system. In particular, the instant invention is directed to an automatic gain control circuit in a cascaded telecommunication system having a circuit that takes over control of the gain of the automatic gain control circuit when a reference carrier, normally used to control the gain, is lost or falls below a predetermined threshold level. The circuit that controls the automatic gain control when the pilot signal is lost provides control signals to the automatic gain control based on physical characteristics of the transmission medium used in the telecommunication system, e.g., a twisted pair, a coaxial cable, or an optical filter, and existing environmental conditions.

BACKGROUND OF THE INVENTION

Telecommunication systems typically employ a large number of items of equipment connected in series. For a variety of reasons, it is necessary to maintain the amplitude of the transmitted signal at terminals of the system within certain, sometimes strict, limits. In more complex types of telecommunication systems, the useful signal in a transmission link may be subject to variations and attenuation over distance and time. In cable transmission links, for example, cable attenuation also varies with temperature. Many other factors may be responsible for variations in overall system gain. For example, electronic components, i.e., transistors, etc., are subject to aging and random changes in their characteristics. With open wire lines, there is the added problem of weather conditions accentuating leakage between conductors.

Conventionally, maintenance of the amplitude of the transmitted signal is achieved by using regulators whose function it is to restore amplitude of the signal to a given predetermined value. One such regulator that has gained widespread acceptance is an automatic gain control (AGC) amplifier. The gain of these AGCs is controlled in such a way that a relatively constant output level is maintained. For example, it is well known to transmit, along with the intelligence or useful signal, a pilot signal. At receiving stations, or signal-repeating stations, or other distribution points along the telecommunication signal distribution system, the pilot signal is extracted and measured. A signal, representative of the difference between the amplitude of the received pilot signal and a predetermined reference level, is used to control the gain of the amplifier to keep the gain of the system at a given, relatively constant, level. Accordingly, as the carrier varies, the gain and slope of the amplifier will vary in proportion.

However, there are numerous disadvantages in conventional systems that use embedded pilot signals to determine gain for a given automatic gain control circuit. For example, if there is a loss of pilot signal, or the level of the pilot becomes too low for detection, the gain levels will tend to maximize with a risk of saturating components located downstream of the detected transmission. This may also cause all other channels to be at an undesirable output level at each station in the cascade, thereby causing significant degradation and distortion, and making the system unusable in some instances.

There have been many proposed solutions to the problems encountered when the pilot signal is lost. One of these solutions is to lock the gain of the automatic gain control circuit to a central position when very low values for the pilot tone are detected, as set forth in U.S. Pat. No. 4,158,113 to Lacroix, entitled "Level Regulator Governed By a Pilot Tone."

Another solution is proposed in U.S. Pat. No. 3,470,480 to Smart, et at., entitled "Digital Counter Controlled Automatic Gain Regulator Employing Pilot Signal." By using digital feedback to provide control of the automatic gain regulator via a counter, the counter can only operate to provide one speed, apart from 0. Accordingly, the circuit of Smart, et al. provides a fixed predetermined level for the period during loss of the pilot.

None of the prior solutions overcomes the disadvantages encountered by loss of the pilot signal. Prior solutions merely fix the gain at an arbitrary level different from the maximum. These solutions do not provide for dynamic adjustment of the gain for which the pilot signal was originally employed.

SUMMARY OF THE INVENTION

The present invention provides an improved automatic gain control method and apparatus that overcome the deficiencies of known automatic gain control systems. In particular, the present invention provides a signal that approximates the attenuation of a given transmission medium based on the temperature of the housing in which the automatic gain control circuit is located. When the pilot signal falls below a predetermined level, the gain control element of the system will generate an approximated signal based on a temperature signal received from a thermal circuit in place of the lost pilot signal until such time as the pilot signal is redetected. By providing a thermal attenuation approximation, the invention avoids the drawbacks of maximizing the gain of the automatic gain control circuit of the system, and further provides dynamic automatic gain control that was heretofore unrealized in systems where the gain was fixed at a predetermined level when the pilot was lost.

According to the instant invention, the automatic gain control circuit monitors for the presence of the pilot carrier. If the pilot carrier level falls below a predetermined threshold, the automatic gain control circuit will automatically switch the input of the gain control element to an equivalent thermal setting that is output to the gain control element by the thermal circuit via a DC switch. This will connect the temperature-sensing and compensation circuit of the gain control element, e.g., a Bode circuit, which dynamically controls the gain of the automatic gain control circuit. The gain setting will, therefore, be based on an approximation of what the transmission medium losses should be at a detected temperature of the housing in which the automatic gain control circuit resides. The switch will automatically switch control of the automatic gain control circuit back to the pilot carrier when the pilot signal has been redetected.

It is, therefore, an object of the present invention to provide a method and apparatus for dynamically adjusting the gain of an automatic gain control device when the pilot signal is lost or falls below a predetermined level.

Another object of the present invention is to provide a thermal control circuit that approximates the losses of a given transmission medium of the system, e.g., a coaxial cable, based on the detected temperature of the housing in which the amplifier is disposed.

Yet another object of the present invention is to provide automatic switching between the thermal circuit and the received pilot signal, based on the signal level of the received pilot signal.

It is also an object of the present invention to provide a manual switch that allows the technician to arbitrarily select the pilot or the thermal circuit as the input to the gain control element for testing purposes.

These and other objects and their attendant advantages are achieved by the present invention that provides an automatic gain control circuit, including: a gain element controlling a gain of the automatic gain control circuit; a detector for detecting a pilot signal; a comparator connected to the detector and comparing the detected pilot signal to a predetermined reference signal; a switch connected between an output of the comparator and the gain control element, wherein the switch is activated when the output of the comparator indicates that a level of the detected pilot signal has fallen below a level of the predetermined reference signal; and a thermal circuit connected to the gain control element via the switch, the thermal circuit providing a signal representing the temperature of a housing in which the automatic gain control circuit is disposed, the gain control circuit providing an attenuation characteristic of a transmission medium of a system in which that automatic gain control circuit is implemented, based on a temperature of a housing in which the automatic gain control circuit is disposed, the signal provided by the thermal circuit is used by the gain element in place of the pilot signal to dynamically control the gain of the automatic gain control circuit.

These advantages are also realized by the method of the present invention, which provides a method for controlling gain in a system having an automatic gain control circuit, including the steps of: detecting a pilot signal portion of a signal transmitted by a telecommunication system; inputting the pilot signal to a gain control element of the system, the gain control element controlling a gain of the automatic gain control circuit based on a signal level of the pilot signal; comparing a level of the detected pilot signal to a level of a predetermined reference signal; switching the input of the gain control element from the pilot signal to a thermal signal that is used by the gain control element to generate an attenuation approximation signal when the pilot signal level falls below the predetermined threshold, the attenuation approximation signal representing an approximation of attenuation of the transmitted signal based on thermal characteristics of a transmission medium of the system; and switching the input of the gain control element back to the pilot signal when the pilot signal level is greater than the level of the predetermined signal.

BRIEF DESCRIPTION OF THE DRAWINGS

The invention will be described herein with reference to the following figures in which like reference numerals refer to like elements throughout the various views, and wherein.

DETAILED DESCRIPTION OF PREFERRED EMBODIMENTS

Figure 1:
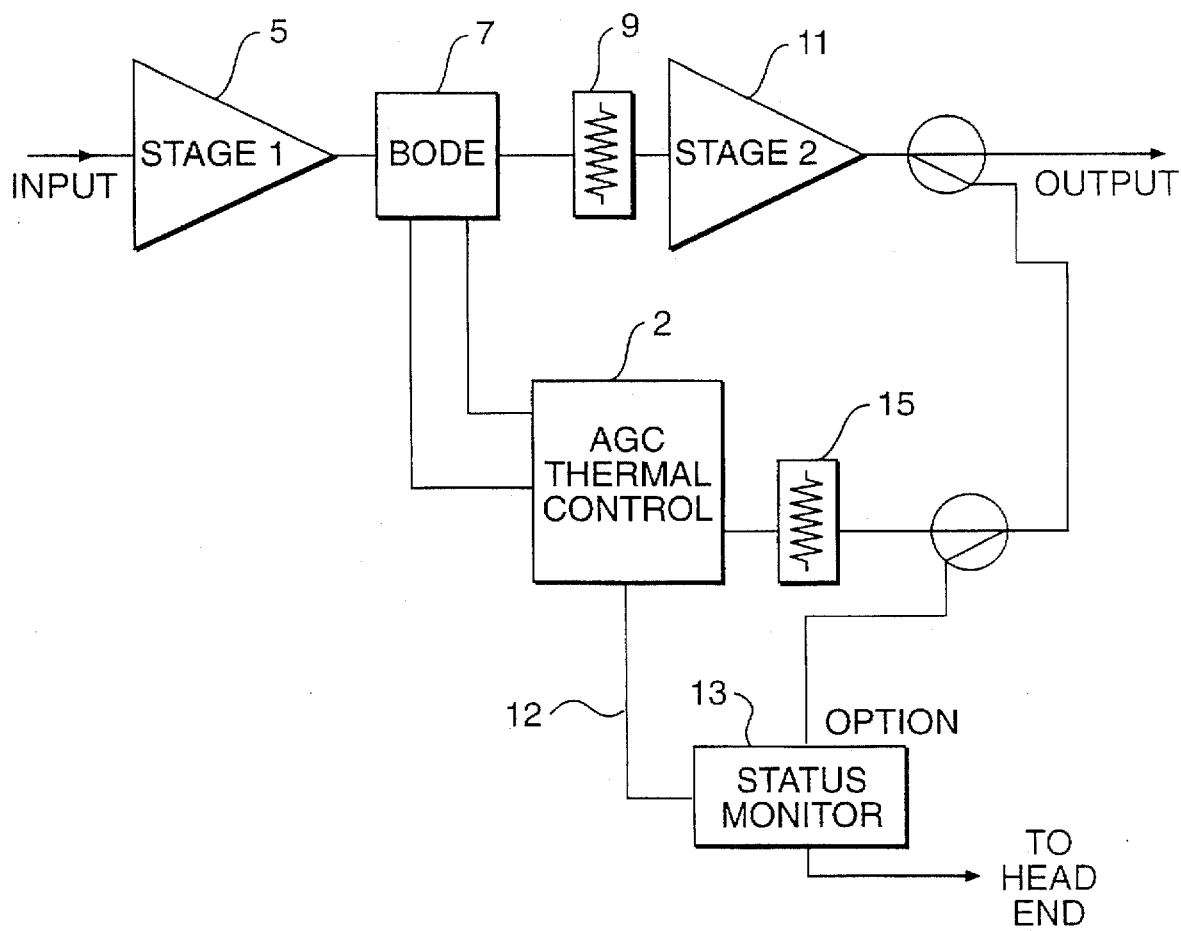
FIG. 1 is a block diagram of an AGC portion of a telecommunication distribution point.

Referring to FIG. 1, a high-level block diagram of an automatic gain control (AGC) circuit according to the present invention, is shown. The AGC circuit of the present invention may be applied in cable distribution amplifiers, repeaters, receiver stations, or other distribution points of a telecommunication signal distribution system. The transmitted signal is received at the input to the amplifier 5. The pilot signal portion of the received signal is input to a Bode circuit 7. The Bode circuit 7 acts as the gain control element of the automatic gain control circuit. Bode circuits are well known to those skilled in the art. Typically, a Bode circuit is a lilt network that simulates cable performance over temperature variation, e.g., high-frequency signals tend to move faster at higher temperatures, and provides tilt compensation for the temperature affected signal. The pivot point of a Bode circuit is usually at 0 Hz. The Bode circuit 7 drives a second amplification stage 11 that provides an output signal having a level adjusted in accordance with the parameters of the system, i.e., either a pilot signal or thermal control of the present invention. The automatic gain control circuit may also optionally include level adjust resistors 9, 15 to bring signals to the desired level to provide a signal indicating that the thermal circuit is part of the component package of the system. The optional status monitor 13 may also receive a signal 12 from the thermal circuit 2, indicating that the thermal circuit 2 has taken over from the pilot and that the pilot has been lost or has fallen below the predetermined threshold. The status monitor 13 may then communicate this condition to the head-end of the system (not shown).

Figure 2:
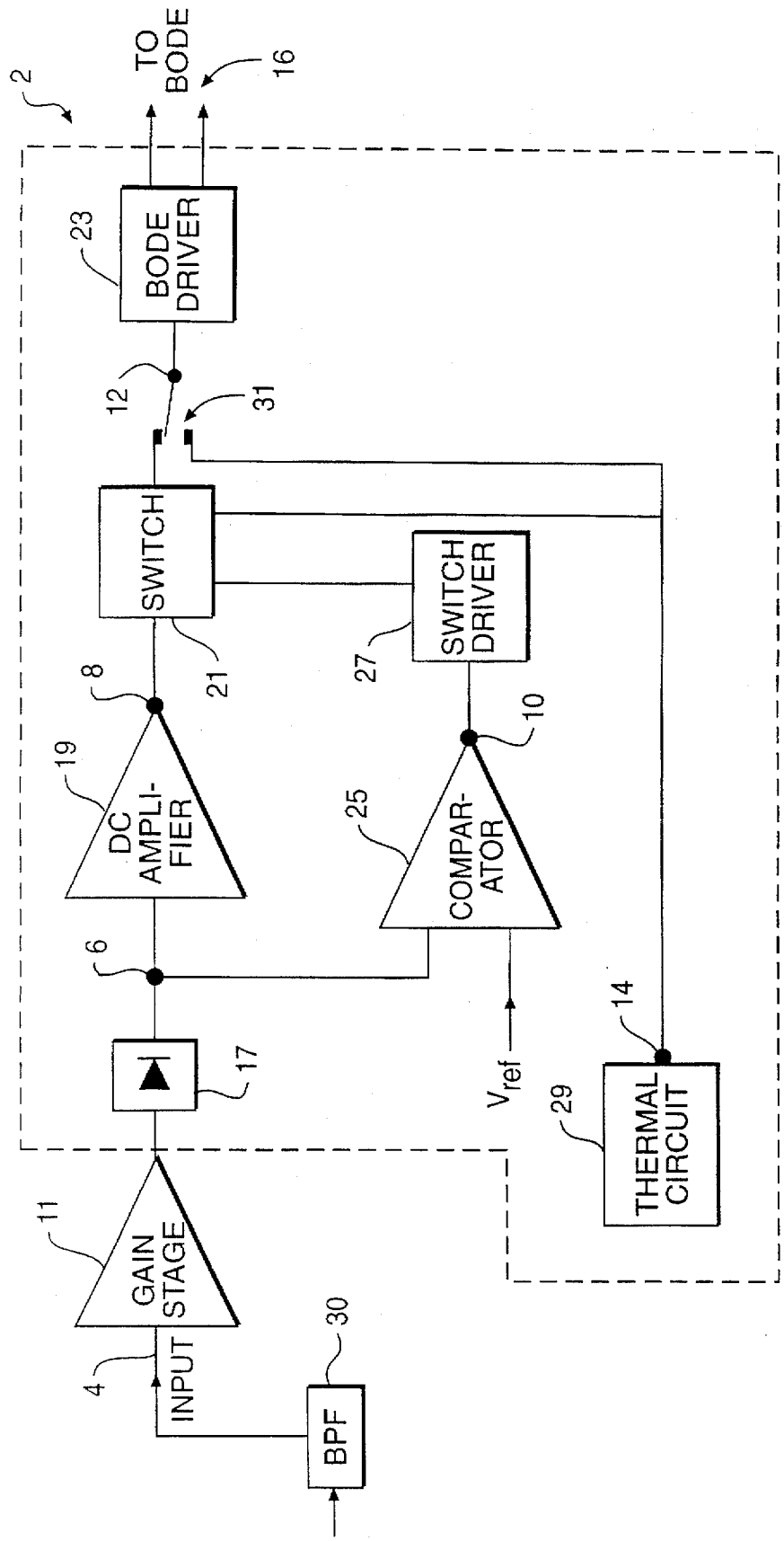
FIG. 2 is a schematic diagram of details of a preferred embodiment of the present invention.

The thermal control circuit 2 monitors for the presence of a pilot signal. Turning now to FIG. 2, details of the thermal control circuit 2 are shown. A band-pass filter 30 receives the transmitted signal. The pass band of the band pass filter 30 is chosen such that it passes the pilot signal to the thermal circuit 2. The thermal circuit 2 includes a detector 17, typically a diode, which monitors the received signal for the presence of a pilot signal. The output of the detector 17 is amplified by a DC amplifier 19 and transmitted to a DC switch 21. The output of the DC switch 21 is output to a Bode driver circuit 23 that is used to drive the Bode circuit 7. The pilot signal is also transmitted from the detector 17 to a comparator 25. The comparator 25 compares the pilot signal level to a predetermined reference level, $V_{ref}$, selected by the designer of the system. If the comparator indicates that the pilot signal level has fallen below $V_{ref}$, a switch driver 27 is activated and provides a signal to the DC switch 21, causing the switch 21 to redirect the input to the Bode driver 23 from the received signal to a signal from thermal circuit 29. The thermal circuit 29 is a temperature-sensing circuit, typically including a thermistor, that produces a voltage proportional to the housing temperature of the housing (not shown) in which the amplifier is disposed. The signal provided by the thermal circuit 29 is directed to the Bode circuit 7 via the switch 21 and the Bode driver 23. Bode circuit 7 provides an approximation of signal attenuation over temperature of a given transmission medium, such as, for example, a coaxial cable. Bode circuit 7 bases its approximation on the detected temperature of the amplifier housing received from the thermal circuit 29.

The automatic gain control circuit may optionally include a manual switch 31 that can be used by a technician for testing purposes. The manual switch 31 allows arbitrary switching of the input of the Bode driving circuit 23 from the pilot signal to the thermal circuit 29, regardless of what the pilot level is.

Figure 3:
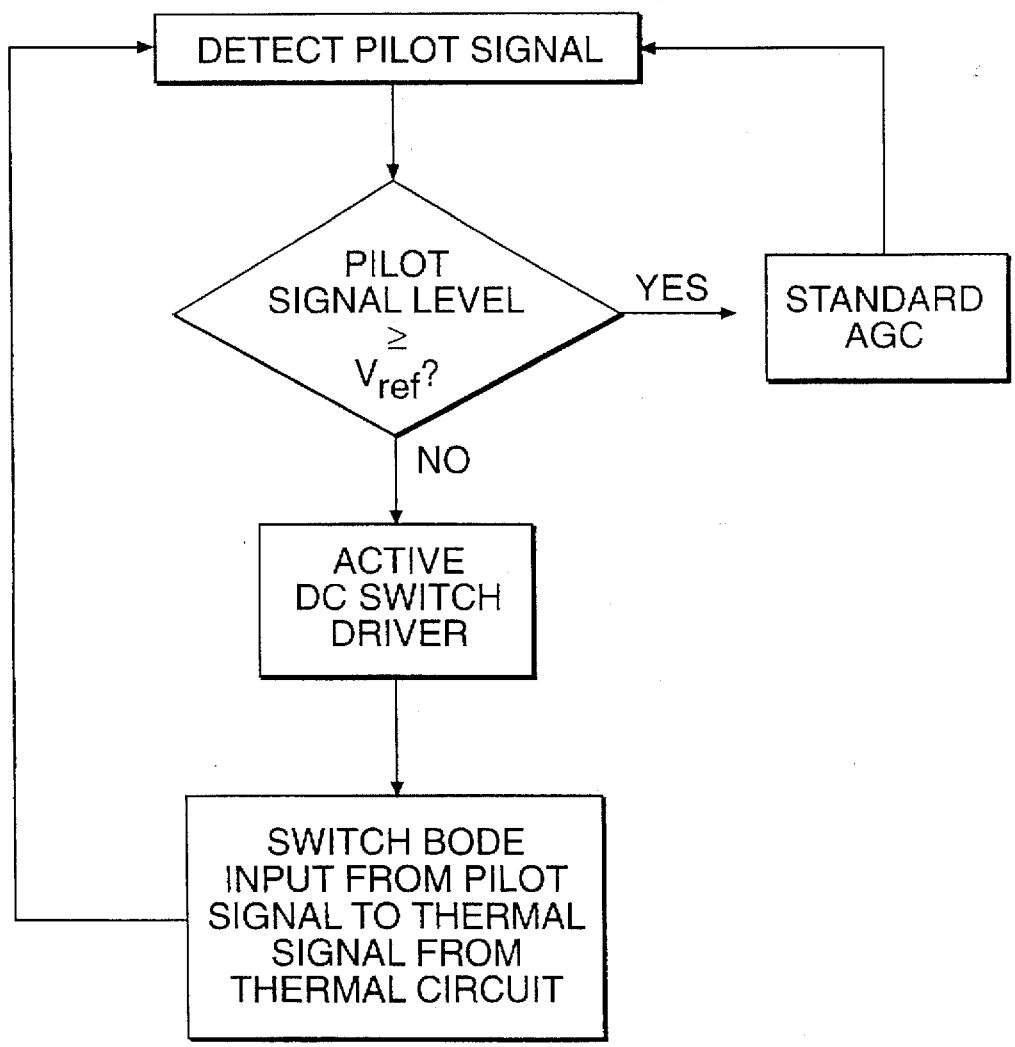
FIG. 3 is a flow chart representing the steps of the preferred embodiment of the instant invention.

The operation of the automatic gain control circuit 1 of the present invention will be described with reference to FIGS. 2 and 3. FIG. 3 is a flow diagram outlining the operation of the system. The sampled output from the main amplifier output is attenuated and applied to point 4. This output is amplified by amplifier 5 and is passed through detector 17 to produce a DC level proportional to the RF voltage at point 6. A DC amplifier 19 is used to increase the gain of the DC level suitable for the Bode driver 23 at point 8. The signal then passes through an electronically controlled switch 21 and an optional manual setup switch 31. Temperature-sensing circuit 29 produces a voltage proportional to the housing temperature at point 14. Comparator 25 compares the detected level of the pilot signal at point 6 with a predetermined reference voltage $V_{ref}$. If the detected level is below $V_{ref}$, the comparator 25 output changes at point 10, thereby activating the switch driver 27 and switching the voltage output by the switch 21 to the thermal voltage obtained by the thermal circuit 29 at point 14. As set forth above, the manual switch 31 at point 12 is for testing and alignment purposes. The signal at point 12 is applied to the Bode driver 23 to provide the current necessary to drive the Bode circuit 7 at point 16.

According to the method shown in FIG. 3, the system monitors the input signal for the presence of a pilot signal. The pilot signal is then compared to an arbitrary reference voltage $V_{ref}$ by the comparator 25. If the signal level of the pilot is less than the reference voltage, the pilot is either missing or has been attenuated to an unacceptably low level. If the pilot signal level is greater than the reference level, the pilot signal is used to drive the Bode circuit 7 via the Bode driver 23. However, if the pilot signal level is below $V_{ref}$, the comparator 25 causes the switch driver 27 to signal the DC switch 21, thus causing the switch 21 to change the signal path from the incoming signal to a signal from the thermal circuit 29. Bode circuit 7 provides a signal having an attenuation based on a temperature of the housing of the amplifier received from the thermal circuit 29. This approximation, while not exact, is based on the theoretical and empirical physical characteristics of the transmission medium of the system, and, nonetheless, provides a dynamically changing signal based on approximation of the attenuation of the incoming signal. The approximation signal is used by the gain control element until such time as comparator 25 indicates that the level of the pilot signal has returned to an acceptable level.

By replacing the pilot signal with a thermal approximation, the present invention provides dynamic adjustment of gain, thereby overcoming the disadvantages of systems that merely fix the gain at an arbitrary, predetermined level, or cause the automatic gain control circuit to maximize gain. The approximation of the present invention, while not exact, provides a reasonably close approximation for providing dynamic gain adjustment.

Any U.S. patents referred to herein should be deemed to be incorporated by reference as to any subject matter believed to be necessary for an understanding of the present invention.

While this invention has been described in conjunction with specific embodiments thereof, it is evident that many alternatives, modifications, and variations will be apparent to those skilled in the art. Accordingly, the preferred embodiments of the invention, as set forth herein, are intended to be illustrative, not limiting. Various changes may be made without departing from the true spirit and full scope of the invention, as defined in the following claims.

What is claimed is:

1. An automatic gain control circuit, comprising:
   a gain element controlling a gain of the automatic gain control circuit;
   a detector for detecting a pilot signal;
   a comparator connected to said detector and comparing the detected pilot signal to a predetermined reference signal;
   a switch connected between an output of said comparator and said gain control element, said switch being activated when the output of the comparator indicates that a level of the detected pilot signal falls below a level of said predetermined reference signal; and
   a thermal circuit connected to said gain element via said switch, said gain element providing a signal representing an attenuation characteristic of a transmission medium of a system in which said automatic gain control circuit is implemented based on a signal representing a temperature of a housing in which said automatic gain control circuit is disposed, said temperature signal being provided by said thermal circuit and being used by said gain element in place of said pilot signal to control a gain of the automatic gain control circuit.

2. The automatic gain control circuit of claim 1, wherein said gain control element comprises a Bode circuit.

3. The automatic gain control circuit of claim 1, wherein said detector is a diode.

4. The automatic gain control circuit of claim 1, further comprising a manually operated switch disposed between said switch and an input of said gain control element.

5. The automatic gain control circuit of claim 1, further comprising a switch driver connected between said comparator and said switch, said switch driver causing said switch to be activated to connect an output of said thermal circuit to said gain control element when said pilot signal level falls below said predetermined signal level.

6. The automatic gain control circuit of claim 1, further comprising:
   an input gain stage having an output connected to said detector;
   a DC amplifier connected between said detector and said switch;
   a switch driver connected between said comparator and said switch, said switch driver causing said switch to be activated to connect an output of said thermal circuit to said gain control element when said pilot signal level falls below said predetermined signal level; and
   a manual switch connected between said switch and said gain control element, said manual switch being activated independently of said pilot signal to control the signal communicated to the gain control stage.

7. The automatic gain control circuit of claim 1, wherein said transmission medium is coaxial cable.

8. The automatic gain control circuit of claim 1, further comprising a status monitor, said thermal circuit providing a signal to said status monitor indicating that the thermal circuit has been engaged, said status monitor transmitting a signal indicating that said thermal circuit has been engaged to a head-end of a telecommunication system in which said automatic gain control circuit is disposed.

9. An automatic gain control device, comprising:
   a thermal circuit providing a signal representing a temperature of a housing in which said automatic gain control device is disposed; and
   a gain control element controlling a gain of said automatic gain control device based on at least one of a received pilot signal and the temperature signal provided by said thermal circuit, said gain control element approximating an attenuated signal having an attenuation based on a thermal characteristic of a transmission medium of a received signal when said gain control element is receiving said temperature signal.

10. The automatic gain control device of claim 9, further comprising a switch, said switch being activated to connect said thermal circuit to said gain control element when a level of said pilot signal falls below a predetermined level.

11. The automatic gain control device of claim 10, further comprising a status monitor, said thermal circuit providing a signal to said status monitor indicating that the thermal circuit has been engaged, said status monitor transmitting a signal indicating that said thermal circuit has been engaged to a head-end of a telecommunication system in which said automatic gain control circuit is disposed.

12. The automatic gain control device of claim 9, wherein said gain control element is a Bode circuit.

13. The automatic gain control device of claim 12, further comprising a manual switch for switching an input of said Bode circuit between a pilot signal and said thermal circuit.

14. The automatic gain control device of claim 9, wherein said transmission medium is coaxial cable.

15. A method of controlling gain in a telecommunication system having an automatic gain control circuit, the method comprising the steps of:

detecting a pilot signal portion of a signal transmitted by said telecommunication system;

inputting the pilot signal to a gain control element of the system said gain control element controlling a gain of the automatic gain control circuit based on a signal level of said pilot signal;

comparing a level of the detected pilot signal to a level of a predetermined reference signal;

switching the input of the gain control element from said pilot signal to a thermal signal representing a temperature of a housing in which said automatic gain control circuit is disposed, said gain control element generating an attenuation approximation signal when said pilot signal level falls below the predetermined reference signal level, said attenuation approximation signal being based on said thermal signal and representing an approximation of attenuation of the transmitted signal based on thermal characteristics of a transmission medium of the system; and switching the input of the gain control element back to the pilot signal when said pilot signal level is greater than the level of the predetermined signal.

16. A method for controlling gain in a telecommunication system having an automatic gain control circuit, the method comprising the steps of:

detecting when a level of a pilot signal used to control a gain of the automatic gain control circuit falls below a predetermined level; and replacing the pilot signal with a thermal signal representative of an attenuation of a signal transmitted over a transmission medium used in the telecommunications system as a function of temperature, said thermal signal being used to generate an approximation signal when the level of the pilot signal falls below the predetermined level, said approximation signal controlling the gain of the automatic gain control circuit.

17. The method of claim 16, comprising the further step of:

switching control of the gain of the automatic gain control circuit to the pilot signal when the level of the pilot signal rises above the predetermined level.

18. The method of claim 16, wherein said approximation signal is generated by a gain element.

19. The method of claim 18, wherein said transmission medium is coaxial cable.

20. The method of claim 16, wherein said step of replacing comprises:

automatically switching an input of a gain control element of the automatic gain control circuit from the pilot signal to the thermal signal.

21. The method of claim 15, comprising the further steps of:

providing a signal indicating that said step of switching has occurred; and transmitting said signal to a head-end of said telecommunication system.

22. The method of claim 16, comprising the further step of:

providing a signal indicating that said step of replacing has occurred; and transmitting said signal to a head-end of said telecommunication system.

* * * * *